(12) United States Patent
Ryan (10) Patent No.: US 6,253,278 B1
(45) Date of Patent: Jun. 26, 2001

(54) SYNCHRONOUS DRAM MODULES INCLUDING MULTIPLE CLOCK OUT SIGNALS FOR INCREASING PROCESSING SPEED (75) Inventor: Kevin J. Ryan, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/290,583

(22) Filed: Apr. 13, 1999

Related U.S. Application Data (63) Continuation of application No. 08/698,069, filed on Aug. 15, 1996, now Pat. No. 5,991,850.

(51) Int. Cl.⁷ .............................. G06F 12/00; G06F 13/00

(52) U.S. Cl. .............................. 711/105; 711/5; 711/115; 711/167; 365/230.03

(58) Field of Search ................................. 711/5, 104, 105, 711/154, 167, 115; 365/52, 230.03

(56) References Cited

U.S. PATENT DOCUMENTS

| | | |
|---|---|---|
| 5,089,993 | 2/1992 | Neal et al. . |
| 5,228,132 | 7/1993 | Neal et al. . |
| 5,261,068 | 11/1993 | Gaskins et al. . |
| 5,287,327 | 2/1994 | Takasugi . |
| 5,440,522 | 8/1995 | Hirano . |
| 5,513,135 | 4/1996 | Dell et al. . |
| 5,524,232 | 6/1996 | Hajeer . |
| 5,586,129 | 12/1996 | Chan . |
| 5,634,803 | 6/1997 | Cheng et al. . |
| 5,686,730 | 11/1997 | Laudon et al. . |
| 5,696,031 | 12/1997 | Wark . |

Primary Examiner—Tuan V. Thai
(74) Attorney, Agent, or Firm—Dickstein Shapiro Morin & Oshinsky LLP (57) ABSTRACT Additional clock-outs are included on DRAMs in a multiple Dual In-Line Module Memory (DIMM) system having DRAMs of different data widths. The additional clock-outs balance the loads seen by the DRAM clock-out and data-out, thereby reducing signal skew between the DRAM data and clock lines. Additionally, in a second embodiment, every other clock line in a series of DRAMs comprising a DIMM are left unconnected. The data from the non connected DRAMs is clocked using the clock line of its neighbor.

32 Claims, 5 Drawing Sheets

SYNCHRONOUS DRAM MODULES INCLUDING MULTIPLE CLOCK OUT SIGNALS FOR INCREASING PROCESSING SPEED

This application is a continuation of application Ser. No. 08/698,069 filed on Aug. 15, 1996, now U.S. Pat. No. 5,991,850 which is hereby incorporated by reference.

BACKGROUND OF THE INVENTION

1. Field of the Invention

The present invention relates to the field of data storage and retrieval, and in particular, data storage and retrieval from semiconductor memories.

2. Background of the Invention

In today's computer environment, DRAMs are one of the dominant memory technologies. DRAMs are the preferred choice for large main memories because they are inexpensive, fast and consume little power.

DRAMs are typically manufactured in discrete semiconductor packages having different input/output (I/O) data widths of, for example, four, eight, or sixteen output data bits, and are thus referred to as x4, x8, or x16 DRAMs, respectively. The number of data bits that a computer can simultaneously address and manipulate, i.e., the computer bus width, is typically much larger than that commonly available with DRAMs. For example, computers produced today may have bus widths of 32, 64, or 128 bits. To accommodate these bus widths, groups of DRAMs are packaged together to form single memory modules, for example, DIMMs (Dual In-line Memory Modules) or SIMMs (Single In-line Memory Modules).

Figure 1:
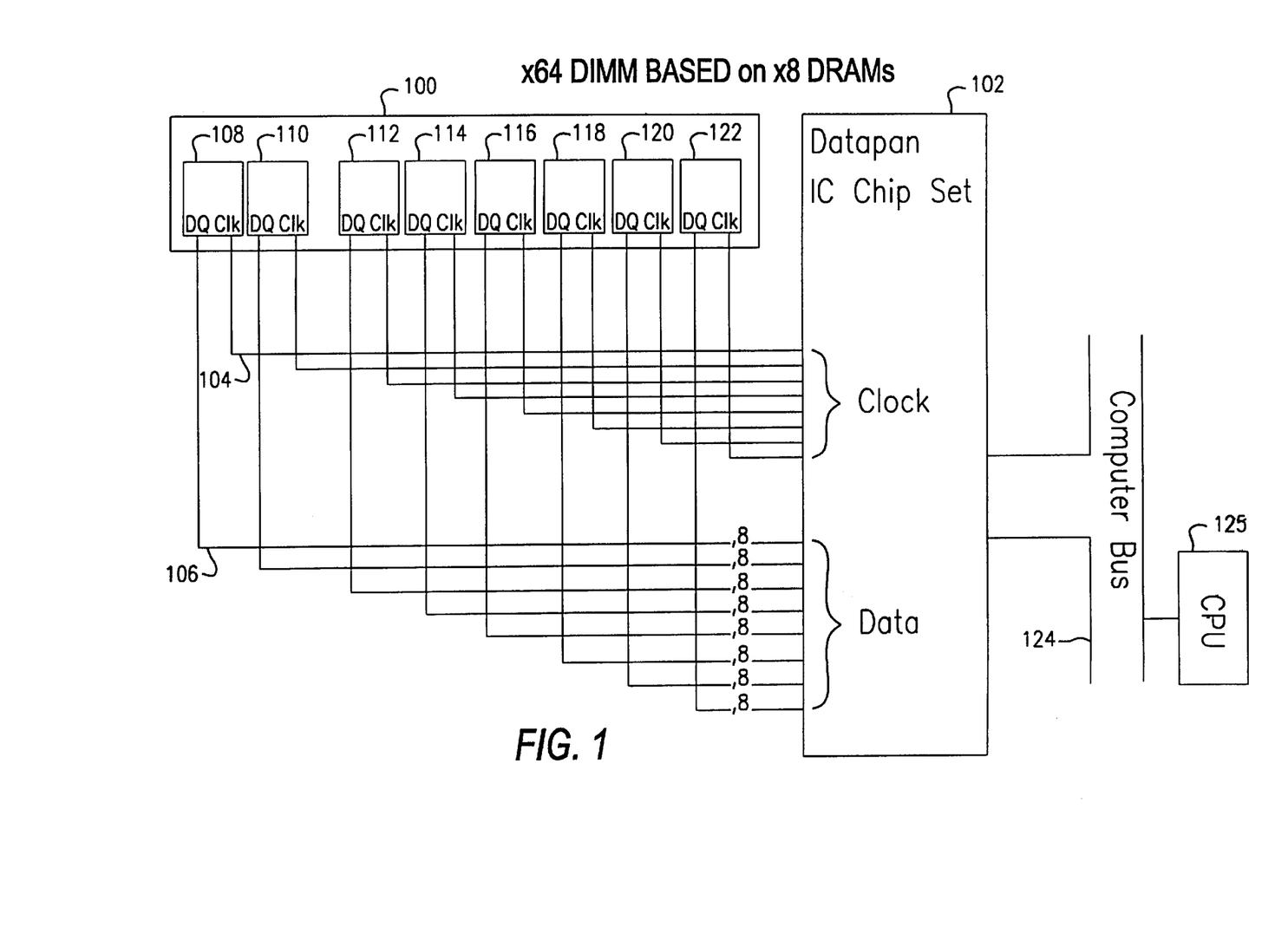
FIG. 1 is a block diagram showing a 64 bit DIMM made from eight, x8 DRAMs.

FIG. 1 is a block diagram showing a proposed 64 bit DIMM including eight x8 DRAMs 108, 110, 112, 114, 116, 118, 120 and 122. IC chipset 102 latches data as one sixty-four bit word from/to DRAMs 108 through 122 and then, when appropriate, transmits/receives the sixty-four bit word on computer bus 124. Central Processing Unit (CPU) 125 is connected to bus 124. Computer bus 124 couples the memory system shown to other sections of the computer. Each DRAM 108–122 includes an 8 bit data out (DQ) bus 106 and a one bit clock-out 104. For clarity, the detailed structure of the DIMM address and enable lines are not shown.

The data from each DRAM 108–122 is transferred to/from IC chipset 102 synchronously. That is, when DRAM 108 outputs data to its data bus 106, it simultaneously raises its clock-out line 104. IC chipset 102 latches the received data from data bus 106 when it detects the raised clock signal.

Load capacitance and signal line length introduce propagation delays in any signal transmitted from the DRAMs 108 through 122 to IC chipset 102. Accordingly, although data may be transmitted simultaneously from DRAMs 122 and 108, data transmitted from DRAM 122 can arrive at IC chipset 102 before data from DRAM 108. In this situation, to receive data from all the DRAMs 108 through 122 in the absence of clock-out signals, IC chipset 102 must wait for the propagation delay associated with each DRAM to resolve itself before initiating latching of all 64 bits. As a result, a long waiting period is required which undesirably restricts the maximum frequency at which the DIMM 100 can operate.

A separate clock line has been proposed on each DRAM, as shown in FIG. 1, in order to overcome the above-described problem. Although the eight data bits from DRAM 108 will experience a different propagation delay than the eight data bits from DRAM 122, for example, the DRAM data is transmitted simultaneously with its own clock signal. Because the data lines and clock lines from, for example, DRAM 108, see the same capacitive load and signal line length, the propagation delays are approximately the same (i.e., the lines are matched), and the clock and data signals therefore arrive simultaneously. This allows the IC chipset 102 to latch the data received from each of DRAMs 108–122 in response to the received clock signal, thereby minimizing the delay encountered with the DIMMs discussed above.

Consumers in the computer industry desire a modular, easily upgradeable memory. To meet this demand, manufacturers have developed modular memory systems which allow additional DIMMs to be added.

Figure 2:
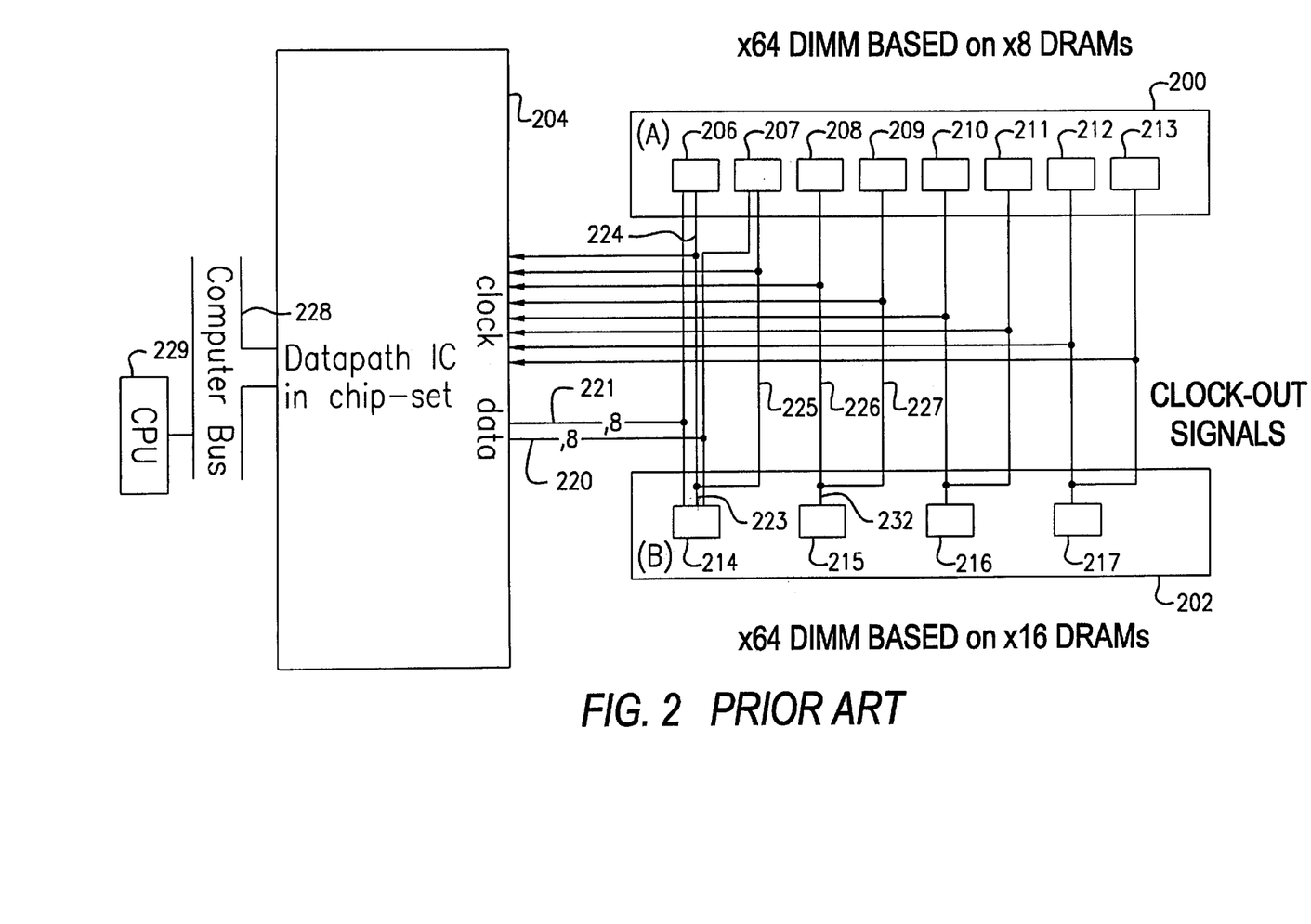
FIG. 2 is a block diagram of a memory system illustrating a conventional memory system constructed from multiple DIMMs.

FIG. 2 is a block diagram of a memory system illustrating a memory system constructed from multiple DIMMs. DIMM 200 includes eight x8 DRAMs 206 through 213 and DIMM 202 has four x16 DRAMs 214 through 217. To simplify FIG. 2, only eight-bit data bus lines 220 and 221 coupling the data outputs of DRAMs 206, 207, and 214 to data path IC 204 are shown. Although not shown, similar data buses connect DRAM groups 208, 209, and 215; 210, 211, and 216; and 212, 213, and 217. DIMM 200 has eight clock-outs connected to corresponding clock lines, one for each DRAM 206 through 213. The clock lines from DRAMs 206 and 207 are illustratively labeled as lines 224 and 225, respectively. DIMM 202 has four clock-outs, so each one is connected to two clock lines from DIMM 200. For example, the clock output 223 of DRAM 214 is coupled to clock lines 224 and 225. Likewise, the clock line 232 of DRAM 215 is connected to clock lines 226 and 227. Further, although not shown in FIG. 2, DIMMs 200 and 202 are connected to IC chipset 204 through a common address bus. Additionally, IC chipset 204 couples DIMMs 200 and 202 to CPU 229 through bus 228.

Occasionally, upgrade DIMMs purchased by the consumer are made from DRAMs of different data widths. As a result, one DIMM will have more clock lines than the other. This is shown in FIG. 2, in which DIMM 200 has eight clock lines and DIMM 202 has four clock lines. Because DRAMs 206 through 213 each have eight data lines, their respective clock-outs can be directly connected to the clock input of IC chipset 204. Each clock line from the x16 DRAM, however, must be split and connected in parallel to two x8 DRAM clock lines.

Splitting the clock lines from the x16 DRAMs 214 through 217 solves the problem of having a different number of clock lines between DIMMs 200 and 202, but introduces a new problem: splitting the clock line from DRAMs 214 through 217 introduces additional capacitive loads seen by the clock lines, but does not change the capacitive load seen by the data lines. Thus, the load seen by the DRAM clock line is no longer matched to the load of its corresponding data line, thereby introducing differences in the signal propagation time (also called signal skew). As explained above, differences in the signal propagation time between the clock and data signals decrease the speed at which the memory system can operate.

SUMMARY OF THE INVENTION

The advantages and purpose of the invention will be set forth in part in the description which follows, and in part will be obvious from the description, or may be learned by practice of the invention. The advantages and purpose of the invention will be realized and attained by means of the elements and combinations particularly pointed out in the appended claims.

To attain the advantages and in accordance with the purpose of the invention, as embodied and broadly described herein, a dynamic random access memory (DRAM) arranged on a single integrated circuit is provided. The DRAM has a plurality of clock outputs and a plurality of data outputs, a first portion of the plurality of clock outputs being used to synchronously transfer a first portion of the plurality of data outputs.

Further, in another embodiment of the invention, a computer memory is provided which comprises a first memory module including a first plurality of memory components, each of which having a plurality of first data outputs and at least one timing signal output. A second memory module is further provided having a second plurality of memory components, each of which having a plurality of second data outputs and at least one timing signal output, a number of the first plurality of memory components is different than a number of the second plurality of memory components. A plurality of data lines couples each of the plurality of first data outputs of each of the first plurality of memory components to a respective one of each of the plurality of second data outputs of each of the second plurality of memory components. In addition, a plurality of timing signal lines couple each of the timing signal outputs of each of the first plurality of memory components to a respective one of the timing signal outputs of the second plurality of memory components in a one-to-one correspondence Further, in accordance with the present invention, a data processing system is provided which comprises a first memory module including a first plurality of memory components, each of which having a plurality of first data outputs and at least a first timing signal output, and a second memory module including a second plurality of memory components, each of which having a plurality of second data outputs and at least a second timing signal output, a number of said first plurality of memory components is different than a number of said second plurality of memory components. A plurality of data lines couple each of the plurality of first data outputs of each of the first plurality of memory components to a respective one of each of the plurality of second data outputs of each of the second plurality of memory components. In addition, a data routing circuit of the data processing system is coupled to each of the plurality of data lines and at least selected ones of the first and second timing signal outputs of the first and second memory modules, respectively, wherein a ratio of a number of first data outputs to a number of first timing signal outputs coupled to the data routing circuit equals a ratio of a number of second data outputs to a number of second timing signal outputs coupled to the data routing circuit.

Moreover, a method of making a computer memory is provided comprising the steps of: providing a first memory module having a first plurality of memory components, each of which having a plurality of first data outputs and at least one timing signal output; providing a second memory module having a second plurality of memory components, each of which having a plurality of second data outputs and at least one timing signal output, a number of the first plurality of memory components is different than a number of said second plurality of memory components; coupling each of the plurality of first data outputs of each of said first plurality of memory components to a respective one of each of the plurality of second data outputs of each of the second plurality of memory components; and coupling each said at least one timing signal output of each of the first plurality of memory components to a respective one of the at least one timing signal output of the second plurality of memory components, whereby the capacitive load associated with each of the first and second data outputs is equal to a capacitive load associated with each of the first and second timing signal outputs.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention. In the drawings.

Reference will now be made in detail to the present preferred exemplary embodiments of the invention, examples of which are illustrated in the accompanying drawings.

DESCRIPTION OF THE PREFERRED EMBODIMENT

This invention matches the data-out loads (i.e., impedance associated with capacitance, inductance, and resistance of the data lines) and the timing signal or clock-out loads of a multiple DIMM memory system in which the clock output widths of the DRAMs (preferably SDRAMs) of one DIMM do not equal widths of the DRAMs of the second DIMM. DRAM load matching is accomplished by providing multiple clock outputs on a DRAM, each clock output seeing a load matched to its corresponding data output. By matching the data-out loads and the clock-out loads, the invention reduces the difference in the propagation delays between a DRAM's clock-out and data-out, thus improving memory accessing performance.

To illustrate the advantages achieved by the present invention, a discussion of the capacitive loads in the proposed DIMM design and the DIMM of the present invention will be presented below.

Table 1 summarizes the loads seen by the DRAMs 206 through 217 of the conventional DIMMs shown in FIG. 2.

TABLE 1

| DIMMs Present in the System | Data-Out Loads | Clock-out Loads |
|---|---|---|
| DIMM 200 ONLY | 2 | 2 |
| DIMM 202 ONLY | 2 | 3 |
| DIMMs 200 and 202 | 3 | 5 |

The first row of table 1 assumes only DIMM 200 is connected in the memory system. In this case, the clock out of DRAM 206 would "see" two loads: its own output load and the receiving input load of line 224. Each data out line of DRAM 206 would see two loads also, one being its own input/output load and the other being the corresponding input/output load of DRAM 214 (connected via the corresponding data line from bus 221). The system in the first row is balanced and will experience little propagation delay difference because the data-out loads and the clock-out loads are matched.

The second row of table 1 assumes only DIMM 202 is connected into the memory system. With only DIMM 202 in the system, the clock out of DRAM 214 sees 3 loads: its own, and the two input loads of IC chipset 204 (connected to lines 224 and 225). In a manner similar to the previous example, each data line would see two loads. In this configuration, the system is unbalanced, such that the clock lines and data lines will experience a measurable difference in their propagation delay.

In the third row of table 1 the memory system is configured as is shown in FIG. 2, in which both DIMMs 200 and 202 are present. In this configuration, the clock output for each DRAM sees five loads. The clock output 223 of DRAM 214, for example, sees: its own load, the clock out load of DRAM 206, the clock out load of DRAM 207, and the input loads of IC chipset 204 (connected to lines 224 and 225 ). Each data output, however, sees three loads. For example, each data output of DRAM 214 connected to bus 221 sees: its own load, the data input/output load of DRAM 206, and the data input/output load of IC Chipset 204 (connected via a line on bus 221). Thus, in this configuration, each DRAM clock-out sees two more loads than its corresponding data-out, potentially causing significant timing problems due to signal skew.

Figure 3:
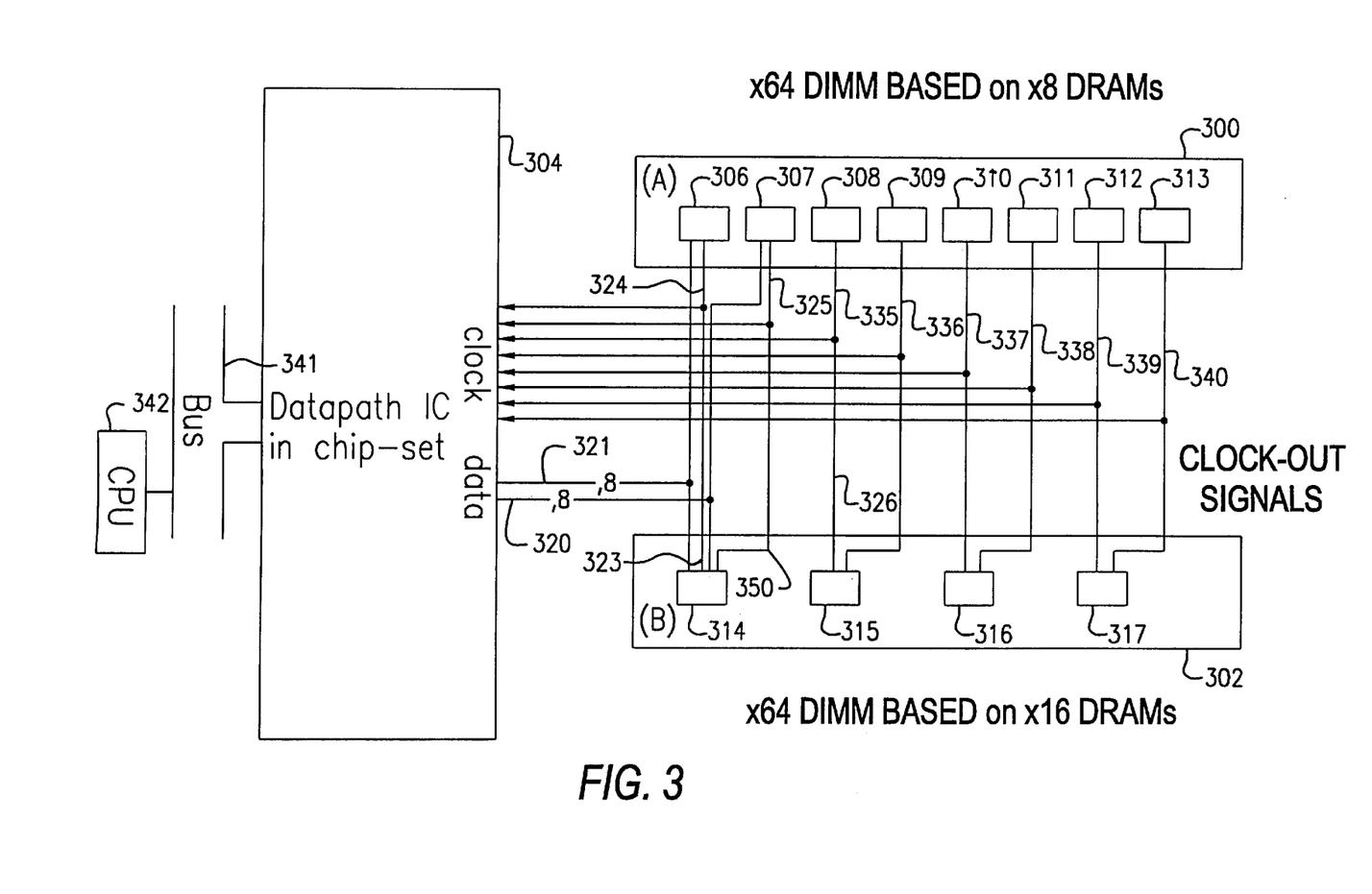
FIG. 3 is a block diagram of the first embodiment of the present invention.

FIG. 3 is a block diagram of the first embodiment of the present invention. Except for DIMM 302, the general structure of FIG. 3 is similar to that of FIG. 2.

DIMM 300 preferably includes eight x8 DRAMs 306 through 313 and DIMM 302 includes four x16 DRAMs 314 through 317. Accordingly, the number of DRAM chips in DIMMs 300 and 302 is different. DIMM 300 shares eight clock lines 324, 325 and 335–340 with DIMM 302. Clock lines 324 and 325, for example, are respectively connected to the clock outputs of DRAMs 306 and 307 and extend to a IC chipset 304, a routing circuit, which couples DIMMs 300 and 302 to computer bus 341 and CPU 342. The remaining clock lines 335–340 are respectively connected between the clock outputs of DRAMs 308–317 and to data path IC 304. Each of the clock outputs of DIMM 300 are coupled to a respective one of the clock outputs of DIMM 302 in a one-to-one correspondence. In order to simplify FIG. 3, only eight-bit data lines 320 and 321 are shown supplying data from DRAMs 306, 307 and 314 to datapath IC Chipset 304. Similar data lines supply data from DRAMs 307–313 and 315–317.

DIMM 302 preferably has eight clock-out lines; two from each DRAM 314 through 317. Each clock output of DRAMs 314 through 317 is constructed so that it sees the same delay, i.e., an equal delay in the system clock is experienced inside the DRAM by both the clock and the data outputs.

Each of DRAMs 314 to 317 preferably include two clock outputs, each of which is respectively coupled to one of the clock outputs of DRAMs 306–313. Accordingly, for example, first clock output line 323 of DRAM 314 is coupled with clock output of DRAM 306 through clock output line 324, while second clock output 350 of DRAM 314 is coupled to the clock output of DRAM 307 through clock output line 325. Similarly, clock output line 335 couples the clock output of DRAM 308 with a first clock output line 326 of DRAM 314, and clock output line 336 couple the second clock output of DRAM 315 with the clock output of DRAM 309. The clock outputs of DRAMs 310–313 and 316–317 are connected similarly, as shown.

As shown in table 2, the novel arrangement of the clock lines in the present invention significantly improves the clock and data load characteristics over the prior art.

TABLE 2

| DIMMs Present in the System | DQ Loads | Clock-out Loads |
| --- | --- | --- |
| DIMM 300 ONLY | 2 | 2 |
| DIMM 302 ONLY | 2 | 2 |
| DIMMs 300 and 302 | 3 | 3 |

For example, when only DIMM 300 is present in the system, the embodiment in FIG. 3 has the same load characteristics as that of FIG. 2. There are two data-out loads and two clock-out loads seen by each data-out and each clock-out, respectively. Thus, the loads are matched and the system does not suffer from delays due to differences in signal propagation delays.

When only DIMM 302 is connected in the first embodiment, each data out sees two loads. For example, each data out of DRAM 314 sees its own input/output load and the input/output of IC chipset 304 (connected via one line on either bus 320 or 321). In addition, each clock-out in DRAM 314 also sees two loads. The first clock out of DRAM 314, for example, sees its own load and the input load of IC chipset 304 (connected via line 324), while the second clock output 350 sees its own load and the input load of IC chipset 304 (connected via line 325). Therefore, as in the previous configuration, the loads are matched.

Moreover, when both DIMM 300 and 302 are present in the memory system the configuration causing the most propagation delay difference in the prior art, the data-out loads and the clock out loads are matched at three each. Namely, the data-out of DRAM 314 corresponding to one of lines 321, for example, sees: its own load, the load of the corresponding input/output pin of DRAM 306, and the load of the corresponding input/output pin of IC chipset 304 (connected via data out line 321). The first clock out of DRAM 314 sees: its own load, the corresponding load of DRAM 306, and the corresponding input load of IC chipset 304; and the second clock sees its own load, the corresponding clock output load of DRAM 307 and the input load of IC chipset 304. Further, the clock output of DRAM 307, for example, also sees three loads. Thus, each clock output and each data output sees three capacitive loads. As such, the data and clock signals output from DIMMs 300 and 302 have the same delay, thereby eliminating the skew encountered by the prior art memory systems. Thus, the ratio of the number of clock outs to DQs of DIMM 300 (i.e., 1:8) equals the ratio of clock outs to DQ of DIMM 302 (also 1:8). Accordingly, as noted above, the capacitive loads seen by each DQ is the same as that seen by each clock out.

Figure 4:
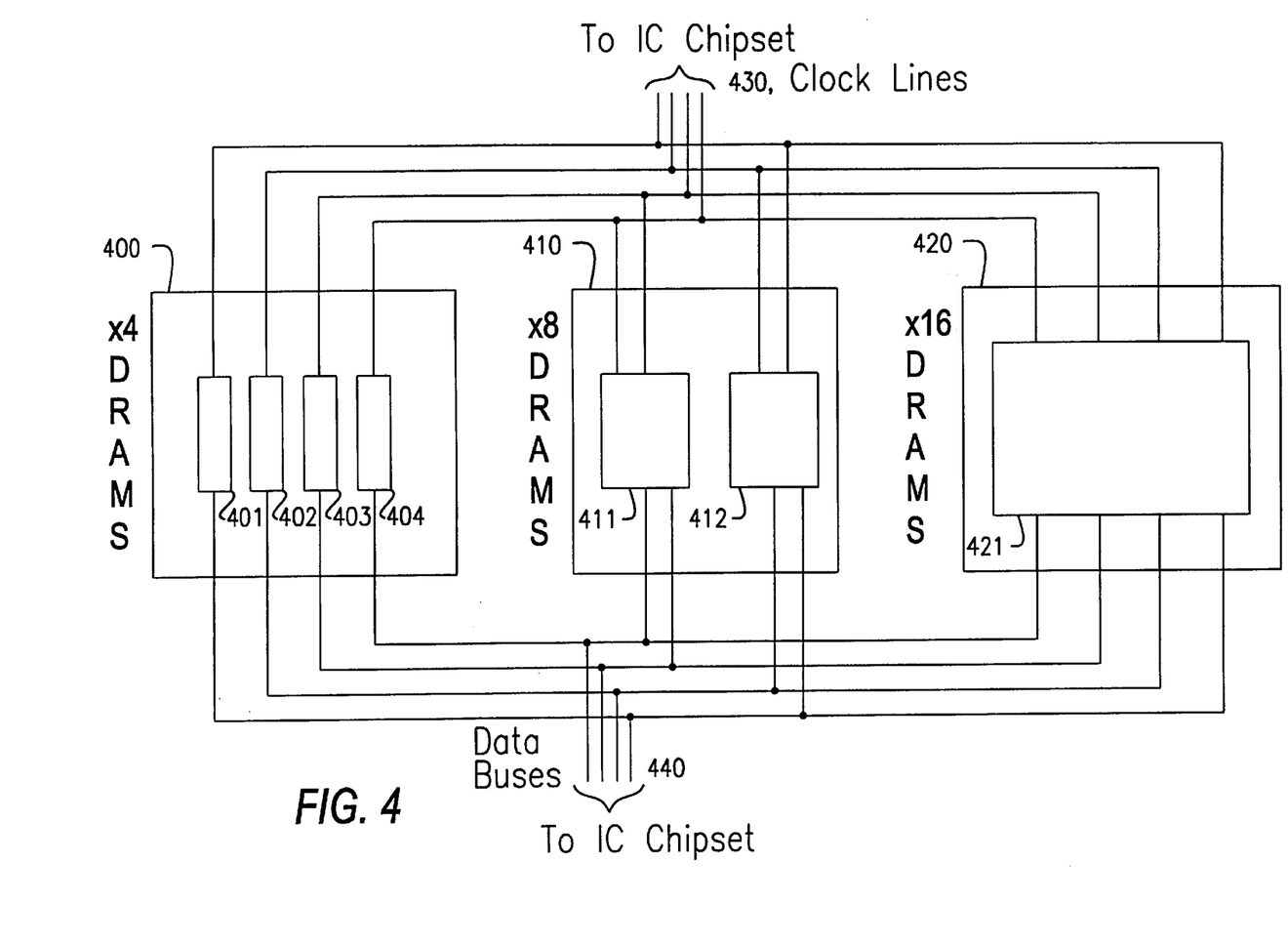
FIG. 4 is a block diagram illustrating one exemplary variation on the first embodiment.

Although the preferred embodiment was described with two DIMMs using x8 DRAMs and x16 DRAMs, the invention is not limited to this configuration. In particular, the present invention can be generally applied to three or more DIMMs using two or more DRAM widths. FIG. 4 is a block diagram illustrating one exemplary variation on the first embodiment. Alternatively, the present invention is applicable to a single module.

In FIG. 4, DIMM 400 includes four x4 DRAMs, 401 through 404; DIMM 410 is comprised of two x8 DRAMs, 411 and 412; and DIMM 420 is comprised of one x16 DRAM, 421. Clock lines 430 and data buses 440 connect the DIMMs to the system IC chipset. As shown in the figure, two clock out lines emanate from the DRAMs 411, 412; four clock-out lines emanate from DRAM 421, and one clock-out line emanates from each of DRAMs 401 through 404. Correspondingly, each DIMM 400, 410, and 420 has four clock-outs. Thus, each clock out sees loads from three pins and a load due to the interconnecting clock line. Similarly, each data-out line sees loads from three pins and a load due to the interconnecting data line.

Figure 5:
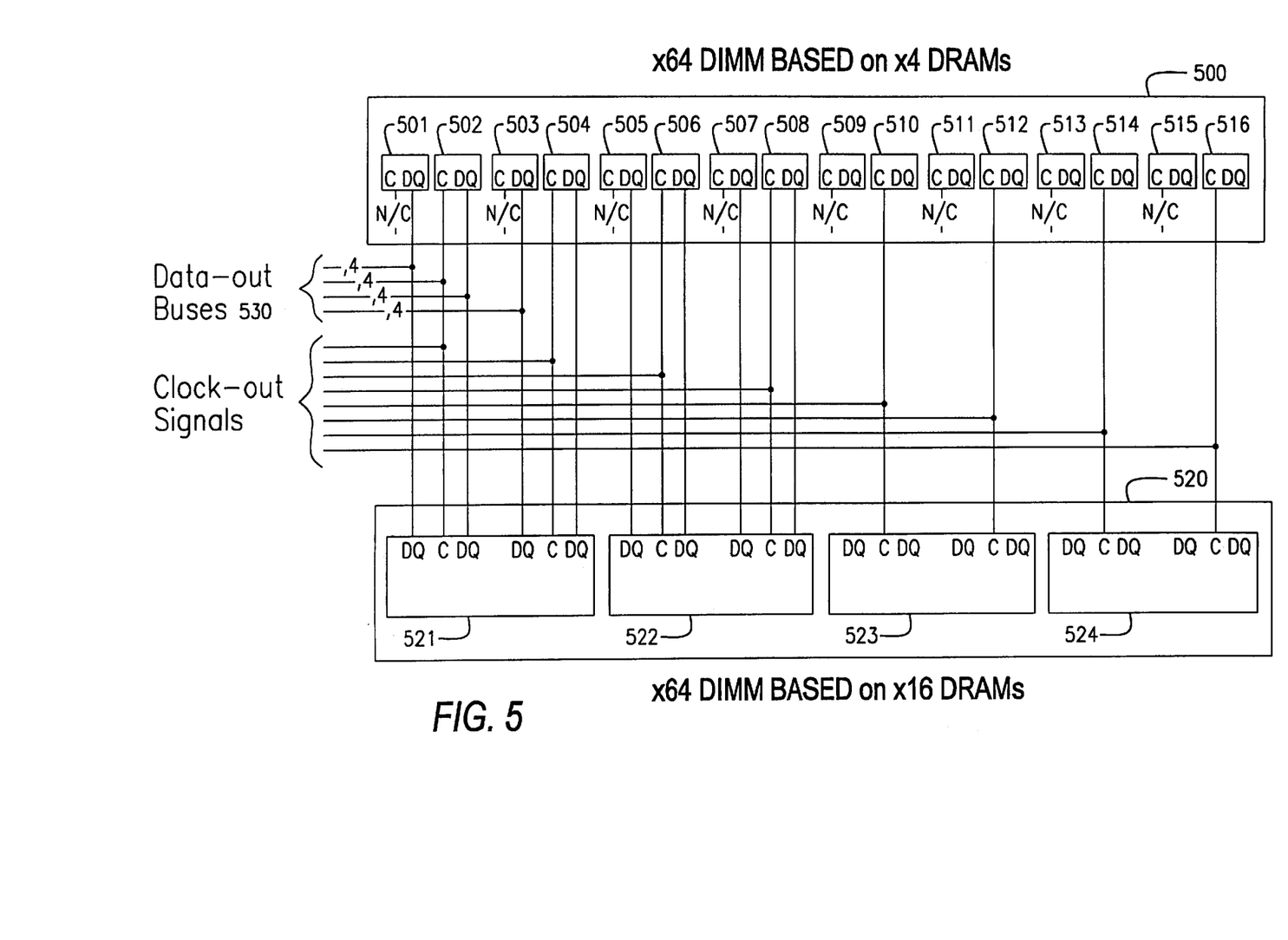
FIG. 5 is a block diagram illustrating a second embodiment of the present invention.

FIG. 5 is a block diagram illustrating a second embodiment of the present invention. FIG. 5 is similar to FIG. 2, except that in FIG. 5, DIMM 500 comprises sixteen x4 DRAMs 501 through 516 instead of eight x8 DRAMs. Each four bit data-out bus 530 from DRAM 501 through 516 is connected in parallel with four bits from DRAMs 521 through 524 to form one sixteen-bit-bus per DRAM 521 through 524. For the sake of clarity, not all the DQ lines are shown.

According to the embodiment shown in FIG. 5, each x16 DRAM has two clock-outs. Each clock out from the x16 DRAMs is connected to the clock out of every other x4 DRAM (clock-outs 502, 504, 506, 508, 510, 512, 514, and 516). The clock-outs of DRAMs 501, 503, 505, 507, 509, 511, 513, and 515 are not connected (N/C).

In operation, DRAMs 501 and 502 transmit and receive data synchronized to the clock signal from DRAM 502. Although there may be some clock skew between the data of DRAM 501 and the clock of DRAM 502, because the DRAM chips 501 and 502 are of the same design and are positioned physically close to one another, the clock skew is minimal (e.g., better than the extreme case of using only one clock out for this module) and well within tolerable system limits.

This embodiment is advantageous because DIMMs constructed with x16 DRAMs having only two clock-outs are rendered compatible with DIMMs constructed with either x8 or x4 DRAMs without excessive system delay.

It will be apparent to those skilled in the art that various modifications and variations can be made to the present invention without departing from the scope or spirit of the invention.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. A computer memory comprising:
   a first memory module including a first plurality of memory components, each of which having a plurality of data outputs of a first data width and at least one timing signal output;
   a second memory module including a second plurality of memory components, each of which having a plurality of data outputs of a second data width and at least one timing signal output, said second data width being different than said first data width, a number of said first plurality of memory components is different than a number of said second plurality of memory components;
   a plurality of data lines coupling each of said plurality of data outputs of each of said first plurality of memory components to a respective one of each of said plurality of data outputs of each of said second plurality of memory components; and
   a plurality of timing signal lines coupling each of said at least one timing signal output of each of said first plurality of memory components to a respective one of said at least one timing signal output of each of said second plurality of memory components in a one-to-one correspondence.

2. A computer memory in accordance with claim 1, wherein a capacitive load associated with each of said data outputs of said first and second memory modules is equal to a capacitive load associated with each of said at least one timing signals of said first and second memory modules.

3. A computer memory in accordance with claim 1, wherein a ratio of a number of data outputs of said first module to a number of timing signal outputs of said first module equals a ratio of a number of data outputs of said second module to a number of timing signal outputs of said second module.

4. A computer memory in accordance with claim 1, wherein said first memory module includes a dual-in-line memory module.

5. A computer memory in accordance with claim 1, wherein said second memory module includes a dual-in-line memory module.

6. A computer memory in accordance with claim 1, wherein each of said first and second pluralities of memory components includes a dynamic random access memory.

7. A computer memory in accordance with claim 6, wherein each said first plurality of memory components includes a x8 dynamic random access memory, and each said second plurality of memory components includes a x16 dynamic random access memory.

8. A computer memory in accordance with claim 6, wherein each of said first plurality of memory components includes a x16 dynamic random access memory and each of said second plurality of memory components includes a x4 dynamic random access memory.

9. A data processing system comprising:
   a first memory module including a first plurality of memory components, each of which having a plurality of data outputs of a first data width and at least one timing signal output;
   a second memory module including a second plurality of memory components, each of which having a plurality of data outputs of a second data width and at least one timing signal output, said second data width being different than said first data width, a number of said first plurality of memory components is different than a number of said second plurality of memory components;
   a plurality of data lines coupling each of said plurality of data outputs of each of said first plurality of memory components to a respective one of each of said plurality of data outputs of each said second plurality of memory components; and
   a data routing circuit of said data processing system coupled to each of said plurality of data lines and at least selected ones of said at least one timing signal outputs of said first and second memory modules, respectively,
      a ratio of a number of data outputs from said first memory module coupled to said data routing circuit to a number of timing signal outputs from said first memory module coupled to said data routing circuit being equal to a ratio of a number of data outputs from said second memory module coupled to said data routing circuit to a number of timing signal outputs from said second memory module coupled to said data routing circuit.

10. A data processing system in accordance with claim 9, wherein a capacitive load associated with each of said data outputs of said first and second memory modules is equal to a capacitive load associated with each said at least one timing signal outputs of said first and second memory modules, respectively.

11. A data processing system in accordance with claim 9, wherein said first memory module includes a dual-in-line memory module.

12. A data processing system in accordance with claim 9, wherein said second memory module includes a dual-in-line memory module.

13. A data processing system in accordance with claim 9, wherein each of said first and second pluralities of memory components includes a dynamic random access memory.

14. A data processing system in accordance with claim 13, wherein each said first plurality of memory components includes a x8 dynamic random access memory having a single timing signal output, and each said second plurality of memory components includes a x16 dynamic random access memory having two timing signal outputs.

15. A data processing system in accordance with claim 13, wherein each of said first plurality of memory components includes a x16 dynamic random access memory and each of said second plurality of memory components includes a x4 dynamic random access memory.

16. A method of making a computer memory comprising the steps of:
providing a first memory module on a first circuit board, said first memory module having a first plurality of memory components, each of which having a plurality of data outputs and at least one timing signal output;
providing a second memory module on a second circuit board different from said first circuit board, said second memory module having a second plurality of memory components, each of which having a plurality of data outputs and at least one timing signal output, a number of said first plurality of memory components is different than a number of said second plurality of memory components;
coupling each of said plurality of data outputs of each of said first plurality of memory components to a respective one of each of said plurality of data outputs of each said second plurality of memory components; and
coupling each of said at least one timing signal output of each of said first plurality of memory components to a respective one of said at least one timing signal output of each of said second plurality of memory components;
whereby a capacitive load associated with each of said data outputs of said first and second memory modules is equal to a capacitive load associated with each said at least one timing signal outputs of said first and second memory modules, respectively.

17. A method in accordance with claim 16, wherein said first memory module includes a dual-in-line memory module.

18. A method in accordance with claim 16, wherein said second memory module includes a dual-in-line memory module.

19. A method in accordance with claim 16, wherein each of said first and second pluralities of memory components includes a dynamic random access memory.

20. A method in accordance with claim 19, wherein each said first plurality of memory components includes a x8 dynamic random access memory, and each said second plurality of memory components includes a x16 dynamic random access memory.

21. A method in accordance with claim 19, wherein each of said first plurality of memory components includes a x16 dynamic random access memory and each of said second plurality of memory components includes a x4 dynamic random access memory.

22. A method in accordance with claim 16, wherein a ratio of a number of data outputs of said first memory module to a number of timing signal outputs of said first memory module equals a ratio of a number of data outputs of said second memory module to a number of timing signal outputs of said second memory module.

23. A computer memory system comprising:
a first memory module including a first plurality of memory components, the first memory module having a first plurality of clock outputs for synchronously transferring data, a number of the first plurality of clock outputs being greater than a number of the first plurality of memory components, said first memory module being fabricated on a first circuit board;
a second memory module including a second plurality of memory components, the second memory module having a second plurality of clock outputs for synchronously transferring data from the second module, a number of said second plurality of memory components being different than a number of said first plurality of memory components, said second memory module being fabricated on a second circuit board different from said first circuit board; and
a plurality of timing signal lines coupling the first plurality of clock outputs to the second plurality of clock outputs, each of said timing signal lines coupling one of said first plurality of clock outputs to one of said second plurality of clock outputs.

24. The computer memory system of claim 23, wherein said first memory module is a dual-in-line memory module.

25. The computer memory system of claim 23, wherein said second memory module is a dual-in-line memory module.

26. The computer memory of claim 23, wherein said first and second pluralities of memory components are dynamic random access memories.

27. The computer memory system of claim 26, wherein said first plurality of memory components include a x16 dynamic random access memory, and said second plurality of memory components include a x8 dynamic random access memory.

28. The computer memory system of claim 26, wherein said first plurality of memory components include a x8 dynamic random access memory, and said second plurality of memory components include a x4 dynamic random access memory.

29. The computer system of claim 23, wherein each memory component in each said first and second pluralities of memory components having at least one timing signal output, each of said clock outputs is connected to a respective one of said timing outputs.

30. The computer system of claim 23,
wherein the first memory module further comprises a plurality of first data outputs and the second memory module further comprises a plurality of second data outputs; and the computer system further comprises a plurality of data lines coupling each of said plurality of first data outputs to a respective one of each of said plurality of second data outputs.

31. The computer system of claim 30, wherein the plurality of data lines are further coupled to data inputs of an integrated circuit for transferring data transmitted over the plurality of data lines to a computer bus.

32. The computer memory system of claim 31, wherein the plurality of timing signal lines are further coupled to clock inputs of the integrated circuit for synchronously transferring the data.

\* \* \* \* \*